(12) United States Patent
Lee et al.

(10) Patent No.: US 8,797,071 B2
(45) Date of Patent: *Aug. 5, 2014

(54) SEMICONDUCTOR DEVICE INCLUDING POWER-ON RESET CIRCUIT

(71) Applicant: Fairchild Korea Semiconductor Ltd., Bucheon (KR)

(72) Inventors: Jung-ho Lee, Goyang (KR); Hyun-soo Bae, Guri (KR); Won-hi Oh, Bucheon (KR); Jong-mu Lee, Seoul (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/039,296

(22) Filed: Sep. 27, 2013

(65) Prior Publication Data

US 2014/0021985 A1 Jan. 23, 2014

Related U.S. Application Data

(63) Continuation of application No. 13/324,843, filed on Dec. 13, 2011, now Pat. No. 8,547,144.

(30) Foreign Application Priority Data

Jan. 11, 2011 (KR) .......................... 10-2011-0002882

(51) Int. Cl.
*H03L 7/00* (2006.01)
(52) U.S. Cl.
USPC .......................................... 327/142; 327/198

(58) Field of Classification Search
CPC ......... G06F 1/24; H03K 17/22; H03K 17/223
USPC .......................................... 327/142, 143, 198
See application file for complete search history.

(56) References Cited

U.S. PATENT DOCUMENTS

| | | | |
|---|---|---|---|
| 4,405,871 A | 9/1983 | Buurma et al. | |
| 4,551,841 A | 11/1985 | Fujita et al. | |
| 4,594,518 A | 6/1986 | Pollachek | |
| 4,717,840 A | 1/1988 | Ouyang et al. | |
| 5,039,875 A | 8/1991 | Chang | |
| 5,144,159 A | 9/1992 | Frisch et al. | |
| 5,365,481 A | 11/1994 | Sawada | |
| 5,852,376 A | 12/1998 | Kraus | |
| 6,329,852 B1 | 12/2001 | Seo | |
| 6,452,414 B1 | 9/2002 | Lorenz | |
| 6,552,946 B2* | 4/2003 | Yokozeki | 365/225.7 |
| 6,683,481 B1 | 1/2004 | Zhou et al. | |
| 6,825,701 B2 | 11/2004 | Akiyoshi | |
| 6,870,428 B2 | 3/2005 | Ormson et al. | |
| 6,914,462 B2* | 7/2005 | Kim et al. | 327/143 |
| 7,142,024 B2 | 11/2006 | Youssef | |
| 7,193,907 B2* | 3/2007 | Nakatake et al. | 365/189.09 |
| 7,196,561 B2 | 3/2007 | Bhattacharya et al. | |
| 7,348,816 B2* | 3/2008 | Shin | 327/143 |
| 7,403,051 B1 | 7/2008 | Lesea | |

(Continued)

*Primary Examiner* — William Hernandez
(74) *Attorney, Agent, or Firm* — Okamoto & Benedicto LLP

(57) ABSTRACT

A semiconductor device including a power-on-reset (POR) circuit. The semiconductor device includes a driving voltage generator configured to generate a first voltage that rises at a first slope and subsequently rises at a second slope greater than the first slope and a first POR signal generator configured to receive the first voltage and generate a first POR signal having a first ramp-up time.

13 Claims, 12 Drawing Sheets

(56) References Cited

U.S. PATENT DOCUMENTS

| | | |
|---|---|---|
| 7,667,506 B2 | 2/2010 | Mawet |
| 8,373,457 B2 * | 2/2013 | Kang .......................... 327/142 |
| 8,610,472 B2 * | 12/2013 | Kang .......................... 327/143 |
| 2003/0142571 A1 | 7/2003 | Kanda et al. |
| 2005/0190627 A1 | 9/2005 | Nakatake et al. |
| 2012/0176167 A1 | 7/2012 | Lee et al. |

* cited by examiner

All the NMOS and PMOS operates in sub-threshold region except NM4

SEMICONDUCTOR DEVICE INCLUDING POWER-ON RESET CIRCUIT

CROSS-REFERENCE TO RELATED APPLICATIONS

This application is a continuation of U.S. application Ser. No. 13/324,843, filed on Dec. 13, 2011, which claims the benefit of Korean Patent Application No. 10-2011-0002882, filed on Jan. 11, 2011, in the Korean Intellectual Property Office. The just-mentioned disclosures are incorporated herein by reference in their entirety.

BACKGROUND

The inventive concept relates to a semiconductor device, and more particularly, to a semiconductor device including a power-on reset circuit.

To enable reliable operations of circuits of a multifunctional device, such as a large-scale integration (LSI) device and a power semiconductor device, initial conditions of the circuits need to be set. A power-on-reset (POR) circuit may function to set the initial conditions of the circuits of the multifunctional device.

More specifically, during an increase in internal voltage with a rise in power supplied to a chip, the POR circuit detects a specific electric potential of the power and generate a pulse signal (hereinafter, referred to as a "POR signal"). The POR circuit may be applied to circuit blocks, such as a latch, a flip-flop, and a register, which need to be initialized so that data stored in the circuit blocks can be reset. An ideal POR signal should be stable despite fluctuation of an electric potential due to external noise during a steady-mode operation in power ramp-up.

SUMMARY

The inventive concept provides a semiconductor device including a power-on-reset (POR) circuit that may stably operate even if a power electric potential fluctuates due to noise during a steady-mode operation.

According to an aspect of the inventive concept, there is provided a semiconductor device including: a driving voltage generator configured to generate a first voltage that rises at a first slope and subsequently rises at a second slope greater than the first slope; and a first power-on-reset (POR) signal generator configured to receive the first voltage and generate a first POR signal having a first ramp-up time.

The device may further include a storage unit configured to store data and initialize the stored data by receiving the first POR signal.

The first POR signal generator may include an asymmetric inverter configured to receive the first voltage, invert the first voltage, and generate an output signal that sharply decreases with a rise of the first voltage.

The driving voltage generator may include a beta multiplier.

The driving voltage generator may be further configured to receive a supply voltage rising at a third slope and generate the first voltage. The first slope at which the first voltage rises may be less than the third slope, and the second slope at which the first voltage rises may be greater than the third slope.

The device may further include: a voltage divider connected between a first power supply source and a second power supply source and configured to provide a second voltage from an output terminal thereof; a capacitive unit connected between the output terminal of the voltage divider and the second power supply source; and a second POR signal generator connected to the output terminal of the voltage divider and configured to receive the second voltage and generate a second POR signal having a second ramp-up time. The first ramp-up time may be longer than the second ramp-up time.

The device may further include a storage unit configured to store data and initialize the stored data by receiving the first POR signal or the second POR signal.

The device may further include: a voltage divider connected between a first power supply source and a second power supply source and configured to provide a second voltage from an output terminal thereof; a reference voltage generator configured to generate a reference voltage; and a comparator configured to compare the second voltage of the output terminal of the voltage divider with the reference voltage and generate a third POR signal having a third ramp-up time. The first ramp-up time may be less than the third ramp-up time.

The device may further include a storage unit configured to store data and initialize the stored data by receiving the first POR signal or the third POR signal.

The device may further include: a second POR signal generator configured to generate a second POR signal having a second ramp-up time; and an undervoltage-lockout (UVLO) module configured to generate a third POR signal having a third ramp-up time.

The first ramp-up time may be greater than the second ramp-up time and less than the third ramp-up time.

The device may further include a storage unit configured to store data and initialize the stored data by receiving at least one of the first through third POR signals.

The device may further include a voltage divider connected between a first power supply source and a second power supply source. The second POR signal generator and the UVLO module may receive a voltage from the voltage divider and generate the second and third POR signals, respectively.

The UVLO module may include: a voltage divider connected between a first power supply source and a second power supply source and configured to provide a second voltage from an output terminal thereof; a reference voltage generator configured to generate a reference voltage; and a comparator configured to compare the second voltage of the output terminal of the voltage divider with the reference voltage and generate the third POR signal having the third ramp-time.

The device may further include a capacitive unit connected between the output terminal of the voltage divider and the second power supply source, and the second POR signal generator may be connected to the output terminal of the voltage divider and configured to receive the second voltage and generate the second POR signal having the second ramp-up time.

The first ramp-up time may be longer than the second ramp-up time and shorter than the third ramp-up time.

The device may further include: a voltage divider connected between a first power supply source and a second power supply source and configured to provide a second voltage from an output terminal thereof; a capacitive unit connected between the output terminal of the voltage divider and the second power supply source; a second POR signal generator connected to the output terminal of the voltage divider and configured to receive the second voltage and generate the second POR signal having the second ramp-up time; a reference voltage generator configured to generate a reference voltage; and a comparator configured to compare the second voltage of the output terminal of the voltage divider with the reference voltage and generate the third POR signal having the third ramp-up time.

The first ramp-up time may be longer than the second ramp-up time and shorter than the third ramp-up time.

According to another aspect of the inventive concept, there is provided a semiconductor device including: a driving voltage generator configured to generate a first voltage that rises at a first slope and subsequently rises at a second slope greater than the first slope; a first POR signal generator configured to receive the first voltage and generate a first POR signal having a first ramp-up time; a voltage divider connected between a first power supply source and a second power supply source and configured to provide a second voltage from an output terminal thereof; a capacitive unit connected between the output terminal of the voltage divider and the second power supply source; a second POR signal generator connected to the output terminal of the voltage divider and configured to receive the second voltage and generate a second POR signal having a second ramp-up time; a reference voltage generator configured to generate a reference voltage; a comparator configured to compare the second voltage of the output terminal of the voltage divider with the reference voltage and generate a third POR signal having a third ramp-up time; and a storage unit configured to store data, receive at least one of the first through third POR signals, and initialize the stored data. The first ramp-up time is longer than the second ramp-up time and shorter than the third ramp-up time.

According to another aspect of the inventive concept, there is provided a semiconductor device including: a voltage divider connected between a first power supply source and a second power supply source and configured to provide a first voltage through an output terminal thereof; a capacitive unit connected between the output terminal of the voltage divider and the second power supply source; a POR signal generator connected to the output terminal of the voltage divider and configured to receive the first voltage and generate a first POR signal having a first ramp-up time; a reference voltage generator configured to generate a reference voltage; and a comparator configured to compare the first voltage of the output terminal of the voltage divider with the reference voltage and generate a second POR signal having a second ramp-up time. The first ramp-up time is shorter than the second ramp-up time.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The inventive concept will now be described more fully hereinafter with reference to the accompanying drawings, in which exemplary embodiments of the inventive concept are shown.

Embodiments of the inventive concept are described herein with reference to cross-section illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

Figure 1:
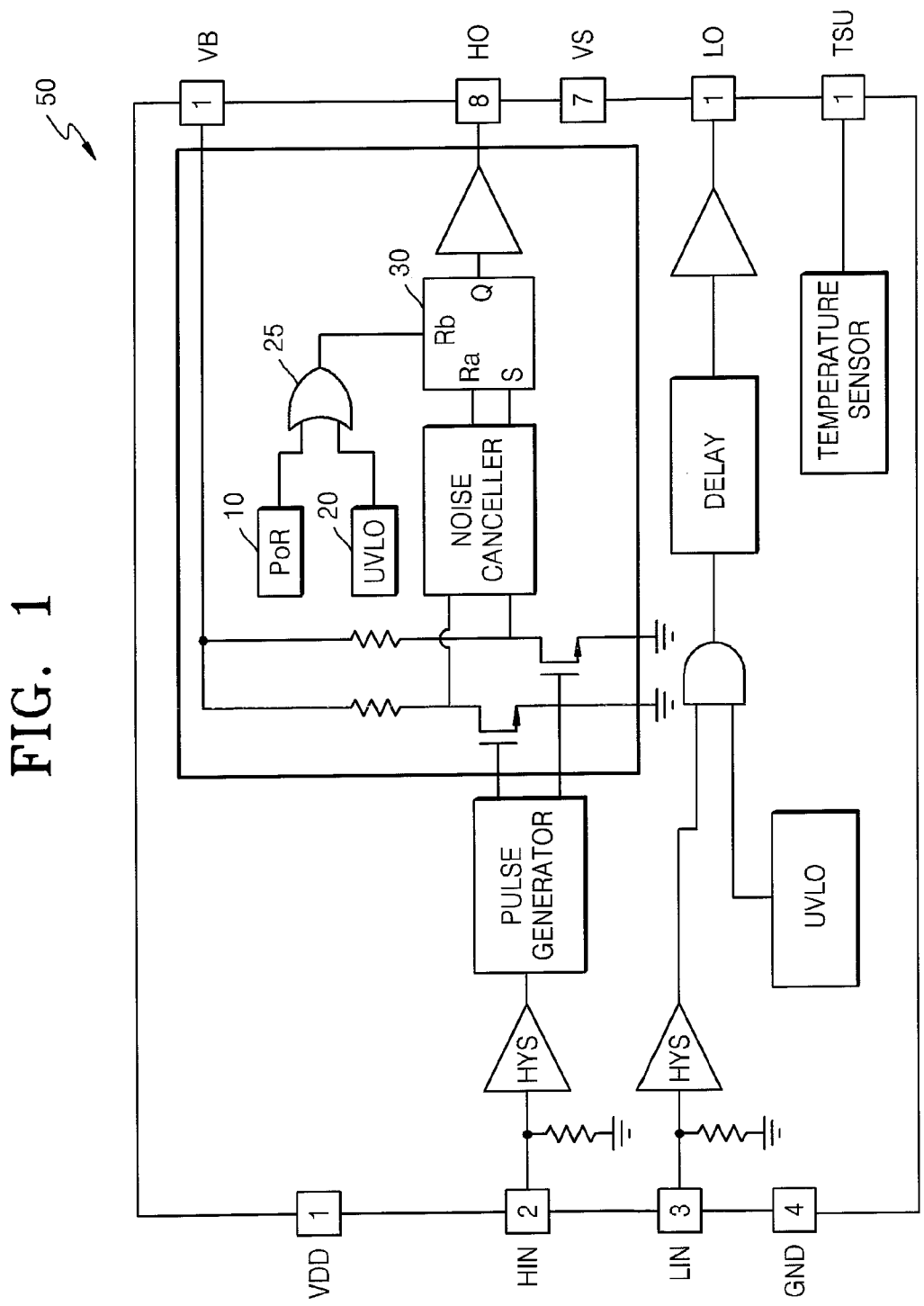
FIG. 1 is a circuit diagram of a semiconductor device including a power-on-reset (POR) circuit according to an exemplary embodiment of the inventive concept.

FIG. 1 is a circuit diagram of a semiconductor device 50 including a power-on-reset (POR) circuit according to an exemplary embodiment of the inventive concept.

Referring to FIG. 1, the semiconductor device 50 may include a POR signal generator 10, an undervoltage-lockout (UVLO) module 20, and a storage unit 30, which may be used for a half-bridge high-voltage gate driver.

The storage unit 30 may be defined as a function block configured to store data. For example, the storage unit 30 may include a latch, a flip-flop, and a register. Although FIG. 1 illustrates an RRS latch as the storage unit 30, the present inventive concept is not limited thereto.

The RRS latch, which is an example of the storage unit 30, may be a latch circuit having two reset terminals, namely, first and second reset terminals Ra and Rb, and a single set terminal S. Thus, the RRS latch may further include the second reset terminal Rb in addition to the basic set terminal S and the first reset terminal Ra. For example, when a high-state voltage is applied to the set terminal S of the RRS latch, the RRS latch may be configured to store the high-state voltage as data. Although the data stored in the RRS latch is continuously retained over time, when a high-state voltage is applied to the first or second reset terminal Ra or Rb of the RRS latch, the RRS latch may be configured to initialize the data stored therein.

In this case, the storage unit 30 may be configured to receive the first or second POR signal and initialize the stored data. To this end, the second reset terminal Rb of the storage unit 30 may be connected to output terminals of the POR signal generator 10 and the UVLO module 20. In particular, the output terminals of the POR signal generator 10 and the UVLO module 20 may be connected to the second reset terminal Rb of the storage unit 30 via an OR gate 25 so that even if only one of first and second POR signals respectively of the POR signal generator 10 and the UVLO module 20 is applied to the storage unit 30, data stored in the storage unit 30 can be reset.

Figure 2:
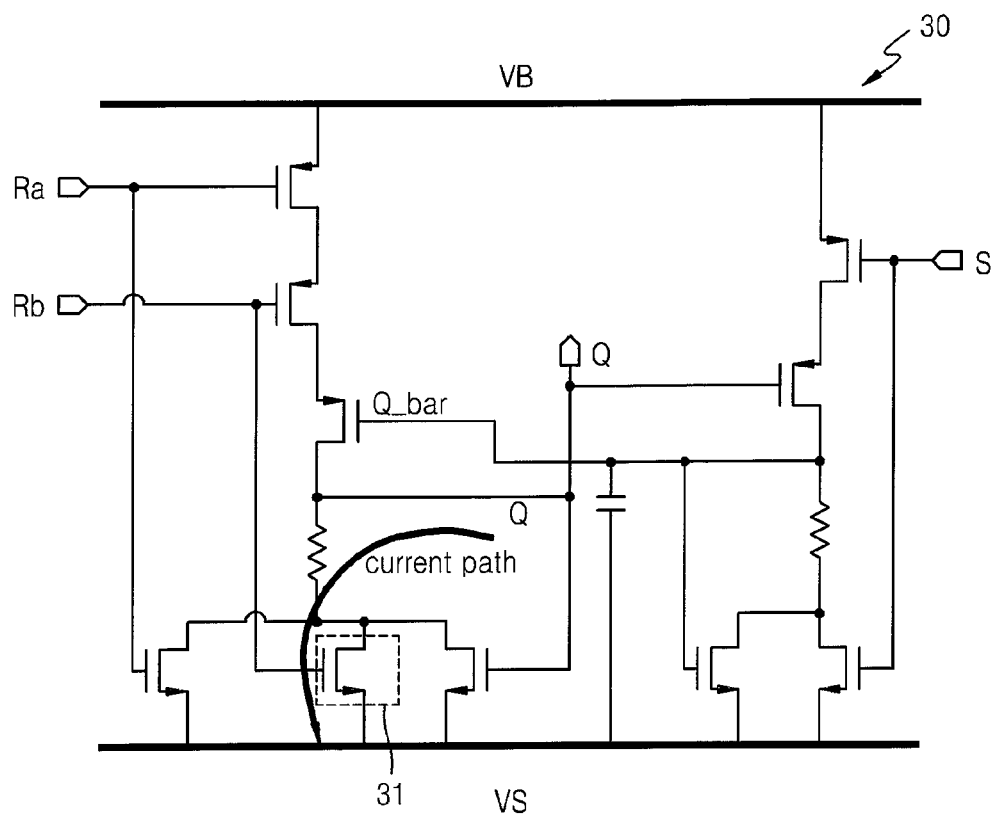
FIG. 2 illustrates initialization of data stored in a storage unit of the semiconductor device of FIG. 1.

FIG. 2 illustrates initialization of data stored in the storage unit 30 of the semiconductor device 50 of FIG. 1. Hereinafter, a repeated description of the storage unit 30 will be omitted.

Referring to FIGS. 1 and 2, the RRS latch, which is an example of the storage unit 30, may be connected between a first power supply source VB and a second power supply source VS. One of the first POR signal and a second POR signal may pass through the OR gate (refer to 25 in FIG. 1) and be applied to the second reset terminal Rb of the RRS latch. An NMOS device 31 connected to the second reset terminal Rb may be enabled in response to the applied signal, and thus, a current path may be formed between an output terminal Q and the second power supply source VS. Thus, data stored as the type of a high-level voltage at the output terminal Q of the RRS latch may be initialized by the current path.

As described above, when the first and second POR signals respectively generated by the POR generator 10 and the UVLO module 20 are applied to the storage unit 30, such as the RRS latch, data stored in the storage unit 30 may be initialized. Also, when a driving power source of the semiconductor device 50 is turned on (that is, when an electric potential of the first power supply source VB gradually increases from 0), the data needs to be initialized. Accordingly, the POR signals should be generated in a predetermined amount of time, for example, with the ramp-up of the first power supply source VB.

Figure 3:
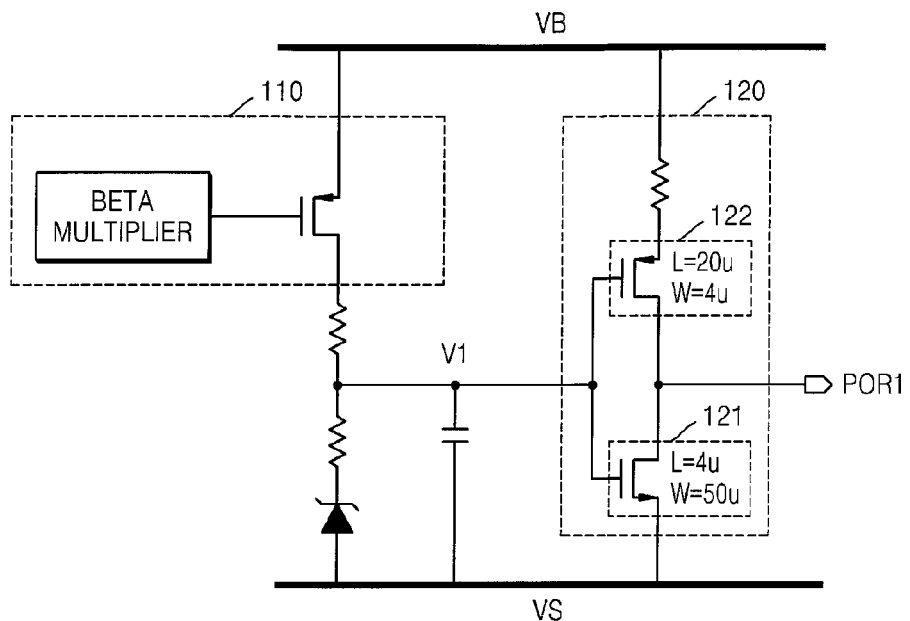
FIG. 3 is a circuit diagram of a semiconductor device according to another exemplary embodiment of the inventive concept.
Figure 4:
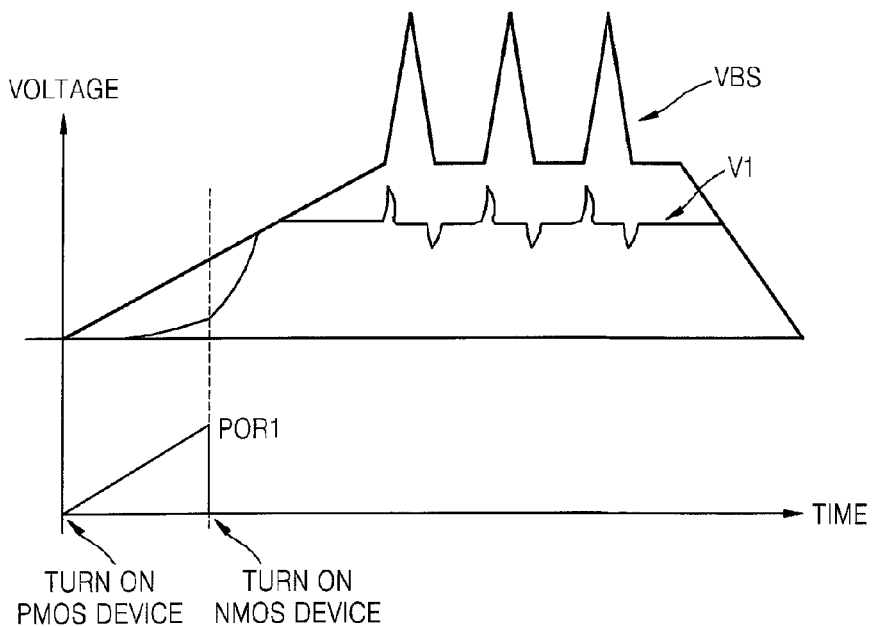
FIG. 4 is a graph showing fluctuation of an output voltage of each node with the ramp-up of a power supply voltage of the semiconductor device of FIG. 3.

FIG. 3 is a circuit diagram of a semiconductor device 100a according to another exemplary embodiment of the inventive concept, and FIG. 4 is a graph showing fluctuation of an output voltage of each node with the ramp-up of a power supply voltage of the semiconductor device 100a of FIG. 3.

Referring to FIG. 3, the semiconductor device 100a may include a driving voltage generator 110 and a first POR signal generator 120.

The driving voltage generator 110 may be configured to generate a first voltage V1 that may rise at a first slope and subsequently rise at a second slope greater than the first slope. To generate the first voltage V1, the driving voltage generator 110 may include a beta multiplier. Construction and operation of the beta multiplier will be described in more detail below with reference to FIGS. 15 and 16.

Specifically, the driving voltage generator 110 may receive a supply voltage VBS corresponding to a difference in electric potential between the first power supply source VB and the second power supply source VS, which may rise at a third slope, and generate the first voltage V1. In this case, the first slope of the first voltage V1 generated by the driving voltage generator 110 may be less than the third slope, and the second slope of the first voltage V1 may be greater than the third slope.

The first POR signal generator 120 may be configured to receive the first voltage V1 and generate a first POR signal POR1 having a first ramp-up time. To this end, the first POR signal generator 120 may include an inverter configured to invert the first voltage V1 and generate an output signal. In particular, the inverter may be an asymmetric inverter. In this case, the asymmetric inverter may be configured to generate the output signal, which may sharply drop with a rise of the first voltage V1.

More specifically, the asymmetric inverter may include an NMOS device 121 and a PMOS device 122. In particular, a ratio of channel width to channel length of the PMOS device 122 may be much greater than a ratio of channel width to channel length of the NMOS device 121.

For example, as shown in FIG. 3, when the channel length and channel width of the PMOS device 122 are about 20 μm and 4 μm, respectively, a ratio of channel width to channel length of the PMOS device 122 may be 0.2. Also, when the channel length and channel width of the NMOS device 121 are about 4 μm and 50 μm, respectively, a ratio of channel width to channel length of the NMOS device 121 may be 12.5.

In this case, a ratio of channel width to channel length of the PMOS device 122 may have a small value of about 0.2. Thus, referring to FIG. 4, as the first voltage V1 applied to a gate terminal of the PMOS device 122 increases, the PMOS device 122 may be turned on so that a voltage of an output terminal of the PMOS device 122 may slowly increase. In contrast, a ratio of channel width to channel length of the NMOS device 121 may have a high value of about 12.5. Thus, referring to FIG. 4, as the first voltage V1 applied to a gate terminal of the NMOS device 121 increases, when the NMOS device 121 is turned on, a voltage of an output terminal of the NMOS device 121 may sharply decrease.

As a result, as the supply voltage VBS between the first power supply source VB and the second power supply source VS increases, the driving voltage generator 110 may generate the first voltage V1, which may rise at a first slope and subsequently rise at a second slope greater than the first slope. Afterwards, the first voltage V1 may be applied to an input terminal of the asymmetric inverter, and the first POR signal POR1 having the first ramp-up time may be generated from an output terminal of the asymmetric inverter. More specifically, the first POR signal POR1 may be ramped up while the first voltage V1 rises at the first slope, and be turned off while the first voltage V1 rises at the second slope.

Although not shown in FIG. 3, as shown in FIG. 1, the semiconductor device 100a may further include a storage unit 30 configured to store data. The first POR signal POR1 applied to the storage unit 30 may initialize the data stored in the storage unit 30.

Figure 5:
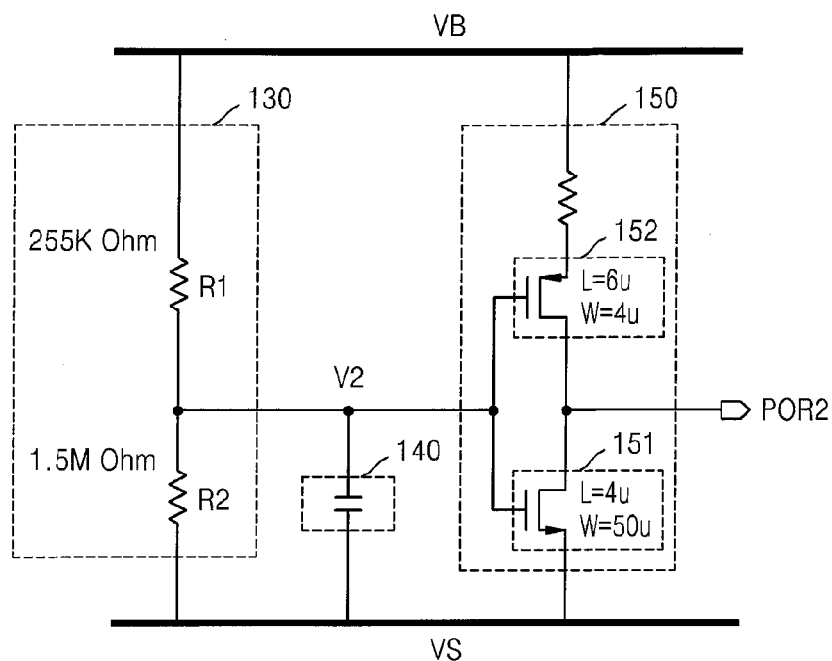
FIG. 5 is a circuit diagram of a semiconductor device according to another exemplary embodiment of the inventive concept.
Figure 6:
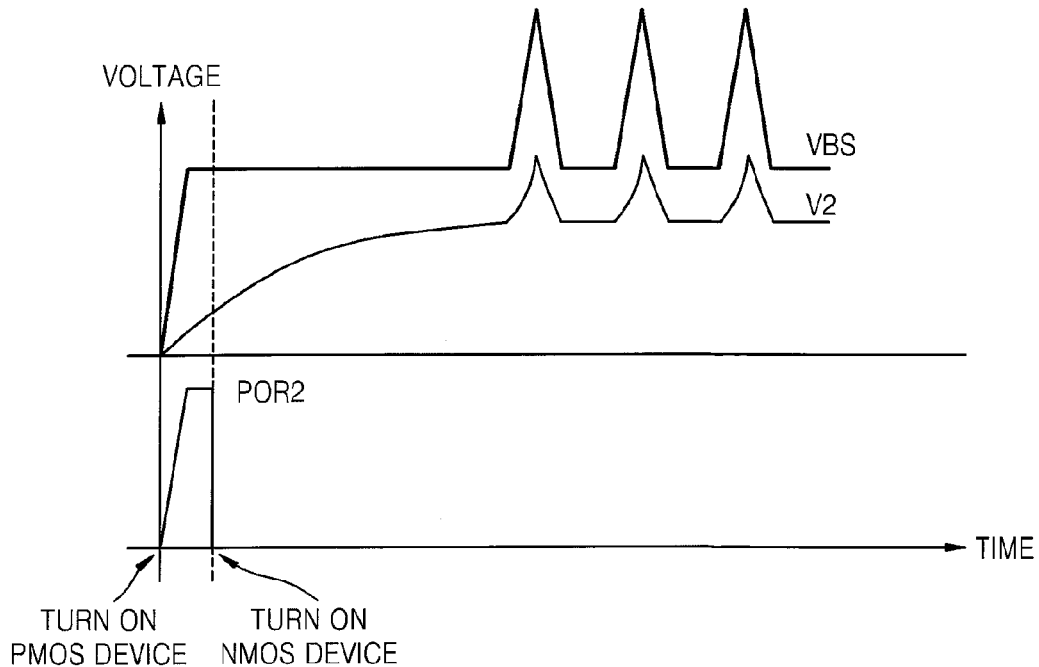
FIG. 6 is a graph showing fluctuation of an output voltage of each node with the ramp-up of a power supply voltage of the semiconductor device of FIG. 4.

FIG. 5 is a circuit diagram of a semiconductor device 100b according to another exemplary embodiment of the inventive concept, and FIG. 6 is a graph showing fluctuation of an output voltage of each node with the ramp-up of a power supply voltage of the semiconductor device 100b of FIG. 4. The semiconductor device 100b according to the present exemplary embodiment may be a modified example of the semiconductor device 100a of FIGS. 3 and 4. Hereinafter, a repeated description will be omitted.

Referring to FIG. 5, the semiconductor device 100b may include a voltage divider 130, a capacitive unit 140, and a second POR signal generator 150.

The voltage divider 130 may be connected between a first power supply source VB and a second power supply source VS and have an output terminal from which the second voltage V2 is output. For example, the voltage divider 130 may include a plurality of resistors, and the second voltage V2 at the output terminal of the voltage divider 130 may vary according to resistances of the resistors of the voltage divider 130.

The capacitive unit 140, such as a capacitive unit, may be connected between the output terminal of the voltage divider 130 and the second power supply source VS. Due to the capacitive unit 140, the time constant of the second voltage V2 at the output terminal of the voltage divider 130 may be defined as in Equation 1:

$$\tau = \left(\frac{R_1 + R_2}{R_1 R_2 C}\right). \quad (1)$$

The second POR signal generator 150 may be configured to receive the second voltage V2 and generate a second POR signal POR2 having a second ramp-up time. To this end, the second POR signal generator 150 may include an inverter configured to invert the second voltage V2 and generate an output signal. In particular, the inverter may be an asymmetric inverter. As described above, the asymmetric inverter may be configured to generate the output signal, which may sharply decrease with a rise in the second voltage V2.

In addition, as described above, the asymmetric inverter may include an NMOS device 151 and a PMOS device 152. In particular, a ratio of channel width to channel length of the PMOS device 152 may be much greater than a ratio of channel width to channel length of the NMOS device 141.

For example, as shown in FIG. 5, when the channel length and channel width of the PMOS device 152 are 6 μm and 4 μm, respectively, a ratio of channel width to channel length of the PMOS device 152 may be 0.33. Also, when the channel length and channel width of the NMOS device 151 are 4 μm and 50 μm, respectively, a ratio of channel width to channel length of the NMOS device 151 may be 12.5.

In this case, referring to FIG. 6, since the ratio of channel width to channel length of the PMOS device 152 has a small value of 0.33, as the second voltage V2 applied to a gate terminal of the PMOS device 152 increases, the PMOS device 152 may be turned on so that a voltage of an output terminal of the PMOS device 152 may increase and be saturated with a rise in a supply voltage VBS. In contrast, since the ratio of channel width to channel length of the NMOS device 51 has a high ratio of 12.5, as the second voltage V2 applied to a gate terminal of the NMOS device 151 increases, when the NMOS device 151 is turned on, a voltage of an output terminal of the NMOS device 151 may sharply decrease.

As a result, as the supply voltage VBS between the first and second power supply sources VB and VS increases, a second voltage V2 having a time constant expressed by Equation 1 may be generated from the output terminal of the voltage divider 130 and applied to an input terminal of the asymmetric inverter so that a second POR signal POR2 having a second ramp-up time may be generated from an output terminal of the asymmetric inverter.

Although not shown in FIG. 5, as shown in FIG. 1, the semiconductor device 100b may further include a storage unit 30 configured to store data. The second POR signal POR2 applied to the storage unit 30 may initialize the data stored in the storage unit 30.

Figure 7:
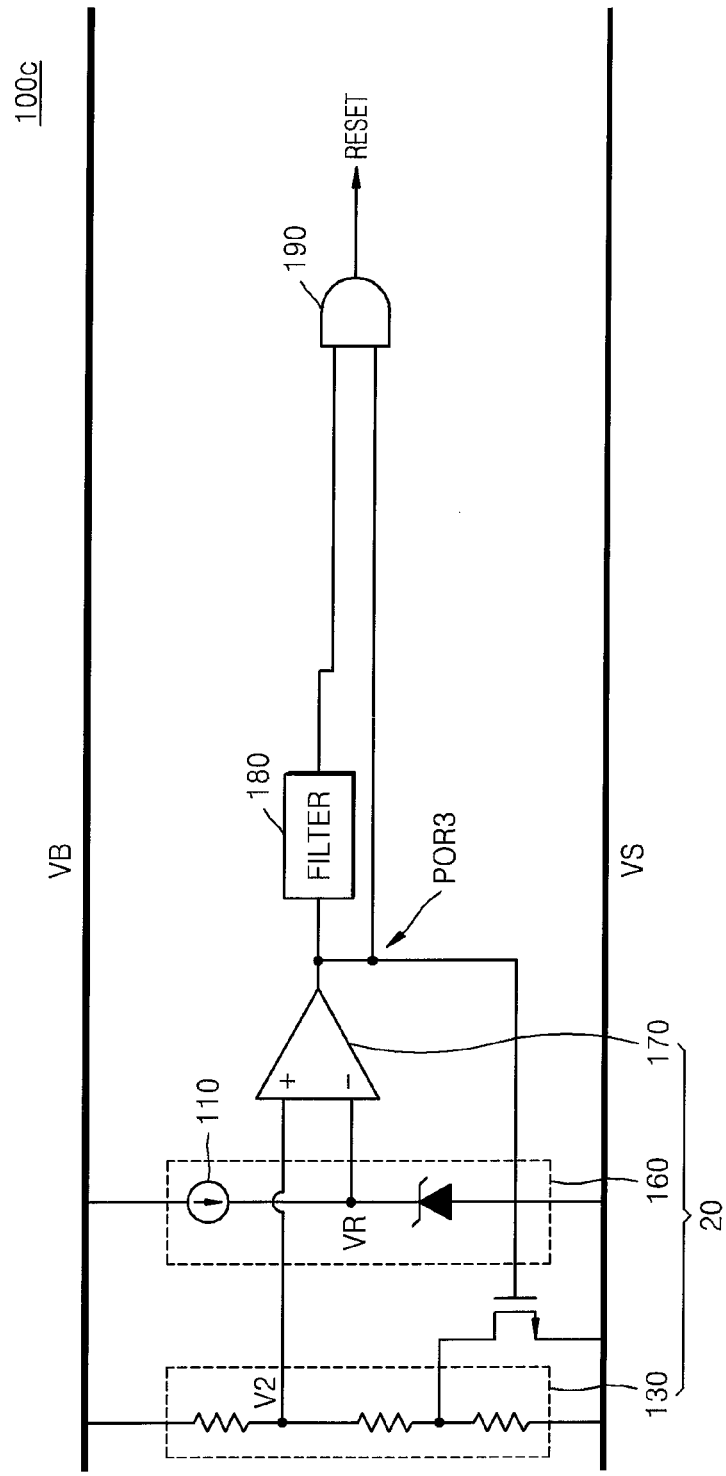
FIG. 7 is a circuit diagram of a semiconductor device according to another exemplary embodiment of the inventive concept.

FIG. 7 is a circuit diagram of a semiconductor device 100c according to another exemplary embodiment of the inventive concept.

Referring to FIG. 7, the semiconductor device 100c may include a voltage divider 130, a reference voltage generator 160, and a comparator 170. In this case, a module including the voltage divider 130, the reference voltage generator 160, and the comparator 170 may be defined as a UVLO module 20.

The voltage divider 130 may be connected between a first power supply source VB and a second power supply source VS and configured to provide a second voltage V2 through an output terminal thereof. For example, the voltage divider 130 may include a plurality of resistors, and the second voltage V2 at the output terminal of the voltage divider 130 may vary according to resistances of the resistors thereof.

The reference voltage generator 160 may be configured to generate a reference voltage VR. In order to generate the reference voltage VR, the reference voltage generator 160 may include a zener diode. In this case, the reference voltage VR may be a zener reference voltage.

The comparator 170 may be configured to compare the second voltage V2 of the output terminal of the voltage divider 130 with the reference voltage VR and generate a third POR signal POR3 having a third ramp-up time. More specifically, the comparator 170 may generate a high-level third POR signal POR3 when the second voltage V2 is lower than the reference voltage VR, and generate a low-level third POR signal POR3 when the second voltage V2 is higher than the reference voltage VR.

Since the second voltage V2 increases in proportion to a supply voltage VBS between the first and second power supply sources VB and VS, the second voltage V2 may be lower than the reference voltage VR in an initial state, and thus, the comparator 170 may generate a high-level third POR signal POR3. However, when the second voltage V2 increases and becomes higher than the reference voltage VR, the comparator 170 may generate a low-level third POR signal POR3. As a result, a third POR signal POR3 having a third ramp-up time may be generated by the comparator 170.

Construction and operation of the comparator 170 will be described in further detail below with reference to FIGS. 13 and 14.

Optionally, in the semiconductor device 100c, an output terminal of the UVLO module 20 may be connected to a filter 180, such as a resistance-capacitance (RC) filter, and an AND gate 190 may be connected to an output terminal of the filter 180. The AND gate 190 may be also connected to an output terminal of the comparator 170. Accordingly, when both the third POR signal POR3 output from the output terminal of the comparator 170 and a signal output from the filter 180 are at a high level, the AND gate 190 may generate a reset signal RESET.

Figure 8:
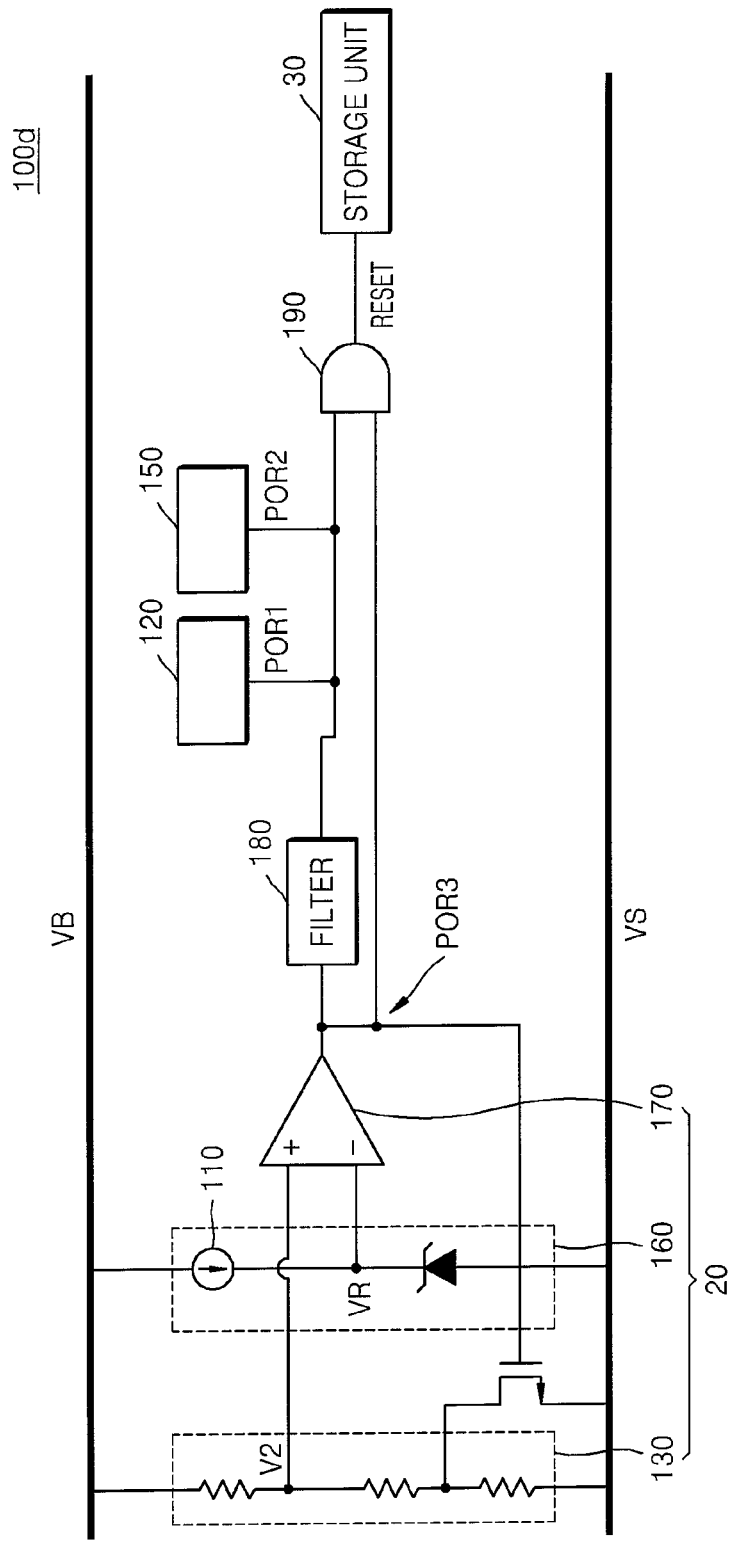
FIG. 8 is a circuit diagram of a semiconductor device according to another exemplary embodiment of the inventive concept.

FIG. 8 is a circuit diagram of a semiconductor device 100d according to another exemplary embodiment of the inventive concept. The semiconductor device 100d according to the embodiment may be a modified example of the semiconductor device 100c of FIG. 7. Hereinafter, a repeated description will be omitted.

Referring to FIG. 8, the semiconductor device 100d may include a first POR signal generator 120, a second POR signal generator 150, a UVLO module 20, and a storage unit 30.

The first POR signal generator 120 may be configured to generate a first POR signal POR1 having a first ramp-up time. The first POR signal generator 120 of FIG. 8 may correspond to the first POR signal generator 120 of FIG. 3.

The second POR signal generator 150 may be configured to generate a second POR signal POR2 having a second ramp-up time. The second POR signal generator 150 of FIG. 8 may correspond to the second POR signal generator 150 of FIG. 5.

The UVLO module 20 may be configured to generate a third POR signal POR3 having a third ramp-up time. As described above with reference to FIG. 7, the UVLO module 20 may include a voltage divider 130, a reference voltage generator 160, and a comparator 170.

Since constructions of the first POR signal generator 120, the second POR signal generator 150, and the UVLO module 20 are described in detail with reference to FIGS. 3, 5, and 7, a repeated description thereof will be omitted.

The storage unit 30, which may store data, may be configured to receive at least one of the first through third POR signals POR1 to POR3 and initialize the stored data in response to the received POR signal. Since the storage unit 30 of FIG. 8 may correspond to the storage unit 30 described in detail with reference to FIG. 1, a repeated description thereof will be omitted.

The first ramp-up time of the first POR signal POR1 may be longer than the second ramp-up time of the second POR signal POR2. In contrast, the first ramp-up time of the first POR signal POR1 may be shorter than the third ramp-up time of the third POR signal POR3.

Accordingly, the semiconductor device 100d according to the embodiment of the inventive concept may generate POR signals having a wide range of ramp-up time. Thus, the semiconductor device 100d may adaptively operate in the wide range of power ramp-up time. That is, since the storage unit 30 may receive at least one of the first through third POR signals POR1 to POR3 having different ramp-up times and perform a data reset operation, even if supply voltages having different ramp-up times are applied, the semiconductor device 100d may perform an appropriate reset operation according to the ramp-up time.

The voltage divider 130 may be shared between the second POR signal generator 150 and the UVLO module 20. That is, both the second POR signal generator 150 and the UVLO module 20 may be configured to receive a second voltage V2 from an output terminal of the voltage divider 130 and generate the second and third POR signals POR2 and POR3, respectively.

Therefore, in the semiconductor device 100d according to the embodiment of the inventive concept, since a POR circuit may be integrated in a UVLO circuit and share a passive device, such as the voltage divider 130, the entire area of the semiconductor device 100d may be reduced.

Although FIG. 8 illustrates the semiconductor device 100d in which the first and second POR signal generators 120 and 150 and the UVLO module 20 are combined with one another, the inventive concept is not limited thereto. That is, according to the inventive concept, it will be understood that any one of a semiconductor device including the first and second POR signal generators 120 and 150, a semiconductor device including the first POR signal generator 120 and the UVLO module 20, and a semiconductor device including the second POR signal generator 150 and the UVLO module 20 may be embodied.

Figure 9:
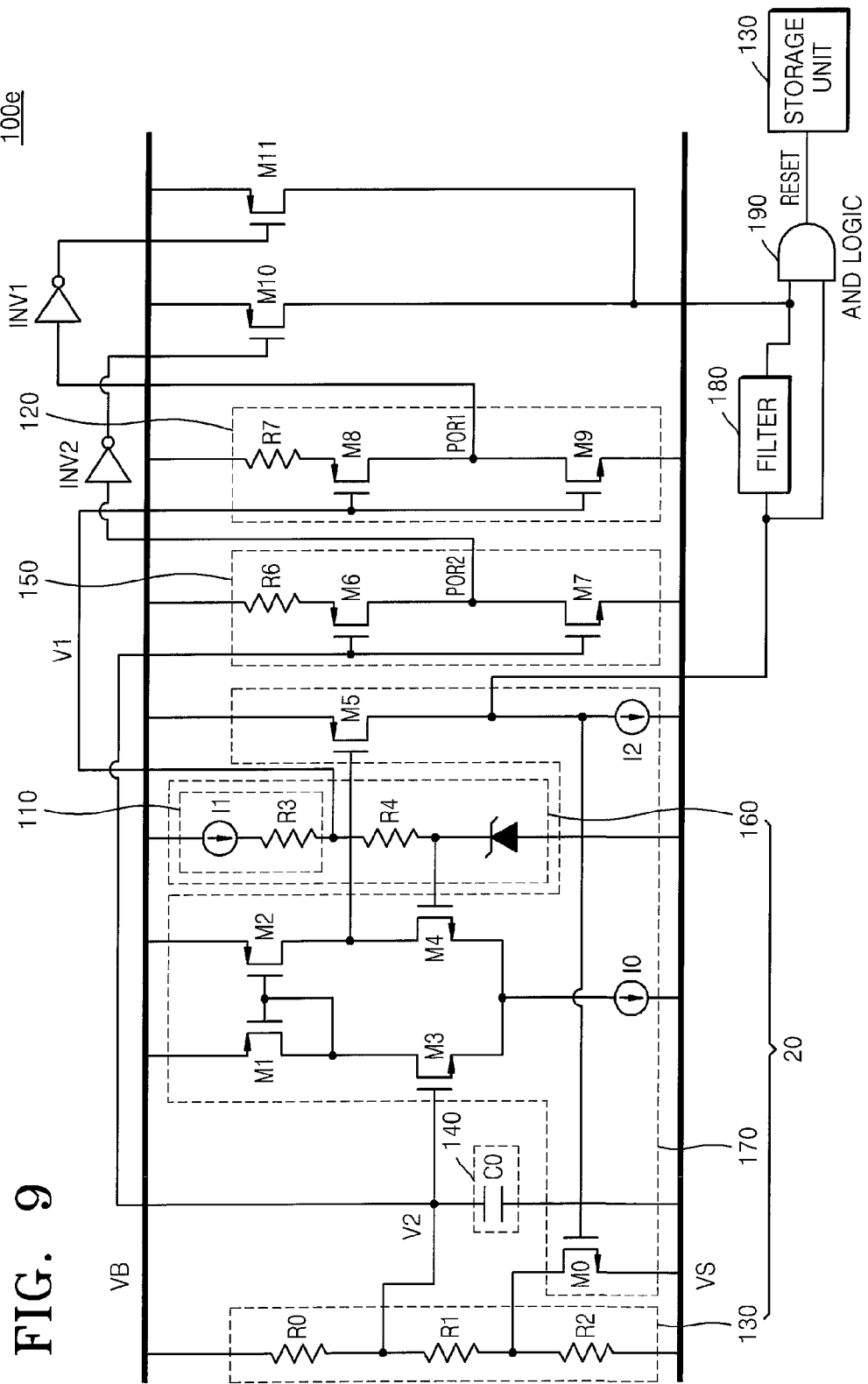
FIG. 9 is a circuit diagram of a semiconductor device according to another exemplary embodiment of the inventive concept.

FIG. 9 is a circuit diagram of a semiconductor device 100e according to another exemplary embodiment of the inventive concept, which may be a detailed circuit diagram of the semiconductor device 100d of FIG. 8. Hereinafter, a repeated description will be omitted.

Referring to FIG. 9, the semiconductor device 100e may include a driving voltage generator 110, a first POR signal generator 120, a capacitive unit 140, a voltage divider 130, a reference voltage generator 160, a comparator 170, and a storage unit 30. Here, the voltage divider 130, the reference voltage generator 160, and the comparator 170 may be some components of a UVLO module 20 configured to generate a third POR signal POR3.

Hereinafter, the principle by which the first through third POR signals POR1 to POR3 are generated will be described in detail. A principle by which the first through third POR signals POR1 to POR3 having different ramp-up times are generated such that the semiconductor device 100e adaptively operates in a wide range of power ramp-up time will be examined.

<First POR Signal POR1>

First, to generate the first POR signal POR1, the driving voltage generator 110 and the first POR signal generator 120 may be used. More specifically, to generate the first POR signal POR1, a current source I1, resistors R3 and R4, a zener diode DO, an asymmetric inverter having transistors M8 and M9, an inverter INV1, and a PMOS device M11 may be employed.

The driving voltage generator 110 may generate a first voltage that may rise at a first slope and subsequently rise at a second slope greater than the first slope. The driving voltage generator 110 may include the current source I1 and the resistor R3. Also, the current source I1 may be a beta multiplier.

The first POR signal generator 120 may be configured to receive the first voltage V1 generated by the driving voltage generator 110 and generate the first POR signal POR1 having a first ramp-up time. The first POR signal generator 120 may include the asymmetric inverter having the transistors M8 and M9, the inverter INV1, and the PMOS device M11.

The first POR signal POR1 generated by the asymmetric inverter may be inverted by the inverter INV1, and the inverted first POR signal POR1 may be applied to the gate terminal of the PMOS device M11. Thus, when the first POR signal POR1 is at a high level, the PMOS device M11 may be turned on so that a reset signal RESET can be applied to the storage unit 30.

The driving voltage generator 110 may be shared between the first POR signal generator 120 and the UVLO module 20. This is because the driving voltage generator 110, including the current source I1 and the resistor R3, is connected to the resistor R4 and the zener diode DO and constitutes the reference voltage generator 160 of the UVLO module 20. Accordingly, the reference voltage generator 160 of the UVLO module 20 may include the driving voltage generator 110 of the UVLO module 20.

<Second POR Signal POR2>

Second, to generate a second POR signal POR2, the voltage divider 130, the capacitive unit 140, and the second POR signal generator 150 may be used. More specifically, to generate the second POR signal POR2, resistors R0, R1, R2, and R3, the capacitive unit 140, an asymmetric inverter including transistors M6 and M7, an inverter INV2, and a PMOS device M10 may be employed.

The voltage divider 130 may be connected between a first power supply source VB and a second power supply source VS and configured to provide a second voltage V2 through an output terminal thereof. The voltage divider 130 may include the resistors R0, R1, and R2, and the output terminal of the voltage divider 130 may correspond to a node between the resistors R1 and R2.

The capacitive unit 140 may be connected between the output terminal of the voltage divider 130 and the second power supply source VS, and thus, the second voltage V2 at the output terminal of the voltage divider 130 may have time constant characteristics expressed by Equation 1. The second voltage V2 at the output terminal of the voltage divider 130 may be applied to gate terminals of the transistors M6 and M7 of the asymmetric inverter.

The second POR signal generator 150 may be connected to the output terminal of the voltage divider 130 and configured to receive the second voltage V2 and generate the second POR signal POR2 having a second ramp-up time. The second POR signal generator 150 may include the asymmetric inverter having the transistors M6 and M7, the inverter INV2, and the PMOS device M10.

The second POR signal POR2 generated by the asymmetric inverter may be inverted by the inverter INV2, and the inverted second POR signal POR2 may be applied to a gate terminal of the PMOS device M10. Thus, when the second POR signal POR2 is at a high level, the PMOS device M10 may be turned on so that a reset signal RESET can be applied to the storage unit 30.

The voltage divider 130 may be shared between a second POR module and the UVLO module 20. That is, the voltage divider 130 may be a component of the comparator 170 of the UVLO module 20 and used to generate the second voltage V2 required to generate both the second and third POR signals POR2 and POR3.

<Third POR Signal POR3>

Third, to generate the third POR signal POR3, the voltage divider 130, the reference voltage generator 160, and the comparator 170 may be employed. More specifically, to generate the third POR signal POR3, resistors R0, R1, R2, R3, and R4, transistors M0, M1, M2, M3, M4, and M5, current sources I0, I1, and I2, and the zener diode DO may be employed.

As described above, the UVLO module 20 may include the voltage divider 130 having the resistors R0, R1, and R2, the comparator 170 having the transistors M0, M1, M2, M3, M4, and M5, and the current sources I0 and I2, and the reference voltage generator 160 having the current source I1, the resistors R3 and R4, and the zener diode DO. Since functions and operations of the voltage divider 130, the comparator 170, and the reference voltage generator 160 are the same as described with reference to FIG. 8, a description thereof will be omitted.

Figure 10:
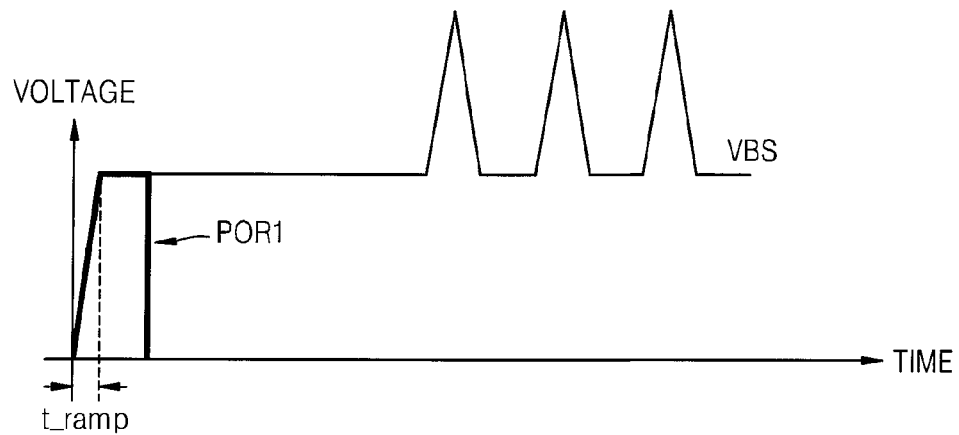
FIGS. 10 through 12 are graphs showing first through third POR signals generated when a power supply voltage having a wide range of ramp-up times is applied to the semiconductor device of FIG. 9.
Figure 11:
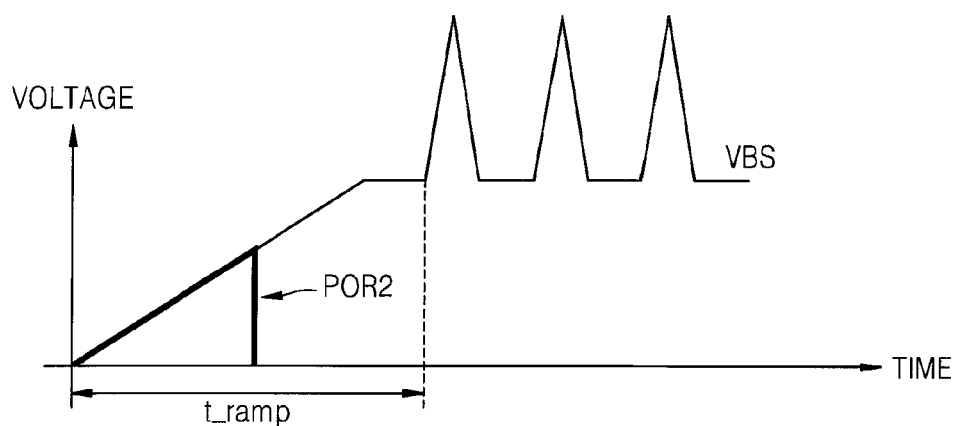
Figure 12:
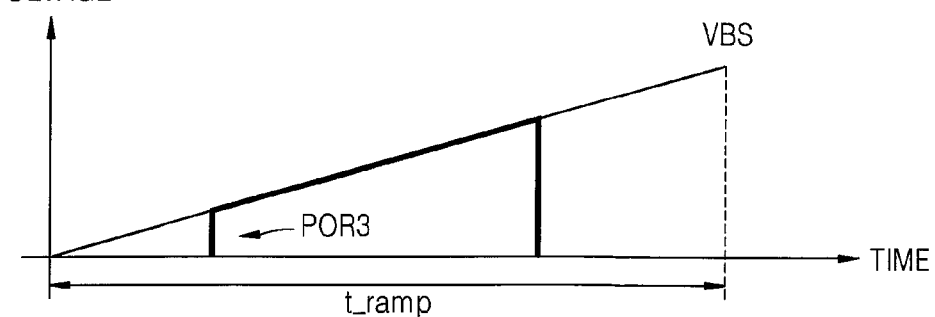

FIGS. 10 through 12 are graphs showing first through third POR signals POR1 to POR3 generated when a power supply voltage having a wide range of ramp-up times is applied to the semiconductor device 100e of FIG. 9.

Referring to FIGS. 9 and 10, when the supply voltage VBS supplied by the first and second power supply sources VB and VS is sharply ramped up, that is, when the supply voltage VBS has a short ramp-up time, a second POR signal POR2 having a second ramp-up time may be employed to reset data stored in the storage unit 30.

In contrast, referring to FIGS. 9 and 12, when the supply voltage VBS supplied by the first and second power supply sources VB and VS is slowly ramped up, that is, when the supply voltage VBS has a long ramp-up time, the third POR signal POR3 having a third ramp-up time may be employed to reset data stored in the storage unit 30.

Referring to FIGS. 9 and 11, when the supply voltage VBS supplied by the first and second power supply sources VB and VS is ramped up at an intermediate slope, that is, when the supply voltage VBS has an intermediate ramp-up time, the first POR signal POR1 having a first ramp-up time longer than the second ramp-up time and shorter than the third ramp-up time may be employed to reset data stored in the storage unit 30.

Accordingly, the semiconductor device 100e according to the embodiment of the inventive concept may generate the first through third POR signals POR1 to POR3 having different ramp-up times. As a result, even if the supply voltage VBS having a wide range of ramp-up times is applied, a POR signal may be generated adaptively to the ramp-up time of the supply voltage VBS so that the storage unit 30 may perform appropriate reset operations.

Hereinafter, operation of the semiconductor device 100e of FIG. 9 will be described in detail.

<Operation of the UVLO Module 20>

Figure 13:
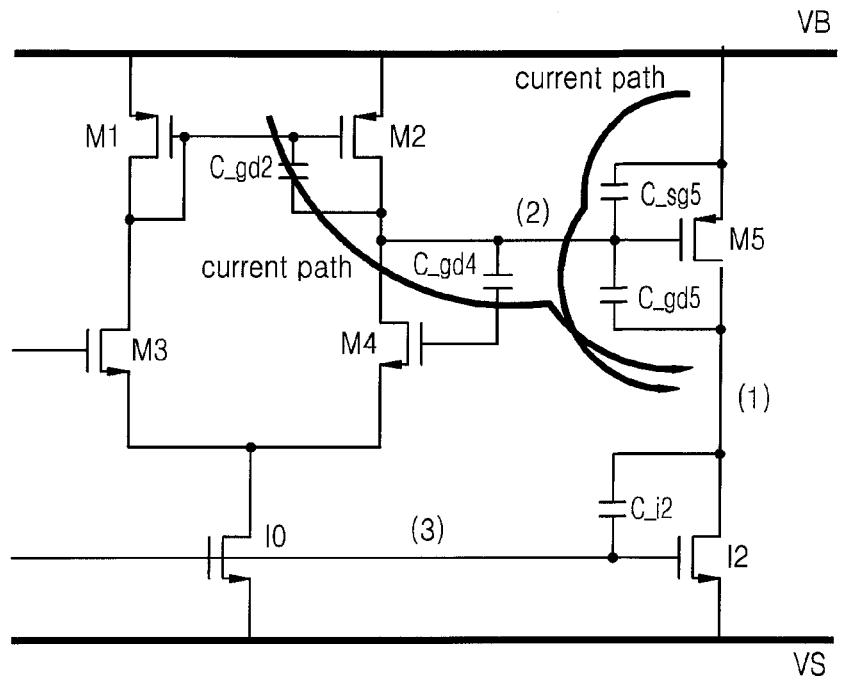
FIG. 13 is a circuit diagram of a comparator of the semiconductor device of FIG. 9.
Figure 14:
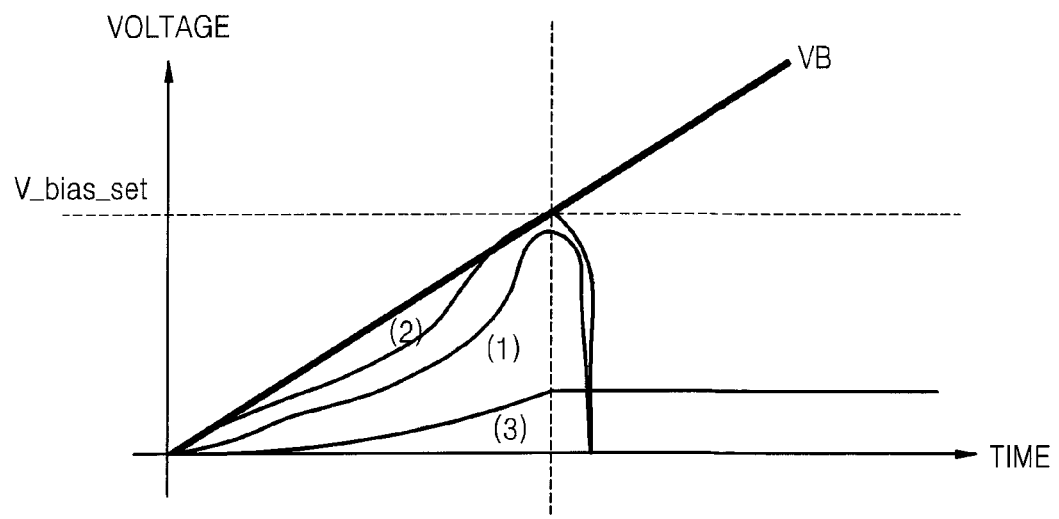
FIG. 14 is a graph showing fluctuation of an output voltage of each node of a comparator with the ramp-up of a first power supply source of the semiconductor device of FIG. 9.

FIG. 13 is a circuit diagram of the comparator 170 of the semiconductor device 100e of FIG. 9, and FIG. 14 is a graph showing fluctuation of an output voltage of each node of the comparator 170 with the ramp-up of the first power supply source VB of the semiconductor device 100e of FIG. 9.

Referring to FIGS. 13 and 14, a portion of the supply voltage VBS may be detected at a non-inverting (+) terminal of the comparator 170 (i.e., a gate of the transistor M3), and a zener reference voltage may be detected at an inverting (−) terminal of the comparator 170 (i.e., a gate of the transistor M4).

Because current is charged through a capacitive divider path shown in FIG. 13, before the NMOS current source I2 operates in a saturated state dominated by a constant (gm) current source during the ramp-up time of the supply voltage VBS, a drain voltage of the transistor M5 may be increased to the supply voltage VBS.

When the NMOS current source I2 does not start forming a path of a saturated current, an output terminal (i.e., node 3) of the comparator 170 of the UVLO module 20 may be defined by capacitive dividers C_gd2, C_dg4, C_sg5, C_gd5, and C_i2. The transistor M1 may reduce the resistance of the resistor R2 and allow the comparator 170 to attain hysteresis. When a portion of the supply voltage VBS reaches the reference voltage VR defined by a zener diode DO, a drain voltage of the transistor M5 may be switched to a ground level. When an output signal of the UVLO module 20 passes through an RC delay filter having a filter time of, for example, about 5 μs, and reaches an AND gate, a reset signal may be de-asserted. This is because an initial assertion of the output signal of the UVLO module 20 is not propagated to a reset terminal of the storage unit 30. Accordingly, a POR function may not be performed during the initial ramp-up time. To solve this problem, two preemptive paths configured to respond to short and/or intermediate ramp-up times of the supply voltage VBS that does not pass through an RC filter may be further provided. The preemptive paths may operate only in an initial period of the supply voltage VBS.

<Operation of the Second POR Signal Generator 150>

The second POR signal POR2 may be generated in response to a short ramp-up time. Out of components required to generate the second POR signal POR2 of FIG. 9, the capacitive unit 140 connected between the output terminal of the voltage divider 130 and the second power supply source VS may need to be noted. That is, the second voltage V2 applied to the output terminal of the voltage divider 130 by the capacitive unit 140 may have a time constant expressed by Equation 1.

In addition, it should be noted that the voltage divider 130 may be shared between the second POR signal generator 150 and the UVLO module 20. That is, the second POR signal generator 150 and the UVLO module 20 may receive the second voltage V2 from the output terminal of the voltage divider 130 and generate the second and third POR signals POR2 and POR3, respectively.

The above-described characteristics may contribute towards reducing the area of a die. For example, in a high-voltage integrated circuit (HVIC) having a supply voltage of about 15V or higher, resistors may take about 24% out of the entire die area. Accordingly, since the voltage divider 130 is shared between the second POR signal generator 150 and the UVLO module 20 according to the inventive concept, the entire area of the semiconductor device 100e may be reduced.

When the supply voltage VBS sharply increases, the second voltage V2 at the output terminal of the voltage divider 130 (i.e., a node voltage of the gate of the transistor M3) may slowly increase. In this case, the second voltage V2 of the gate of the transistor M3 may be applied to the asymmetric inverter including the resistor R6 and transistors M6 and M7. When the second voltage V2 continuously increases and exceeds a threshold voltage of the transistor M7, an output of the asymmetric inverter may make a high-to-low transition and thus, the transistor M10 may be turned on.

<Operation of the First POR Signal Generator 120>

Figure 15:
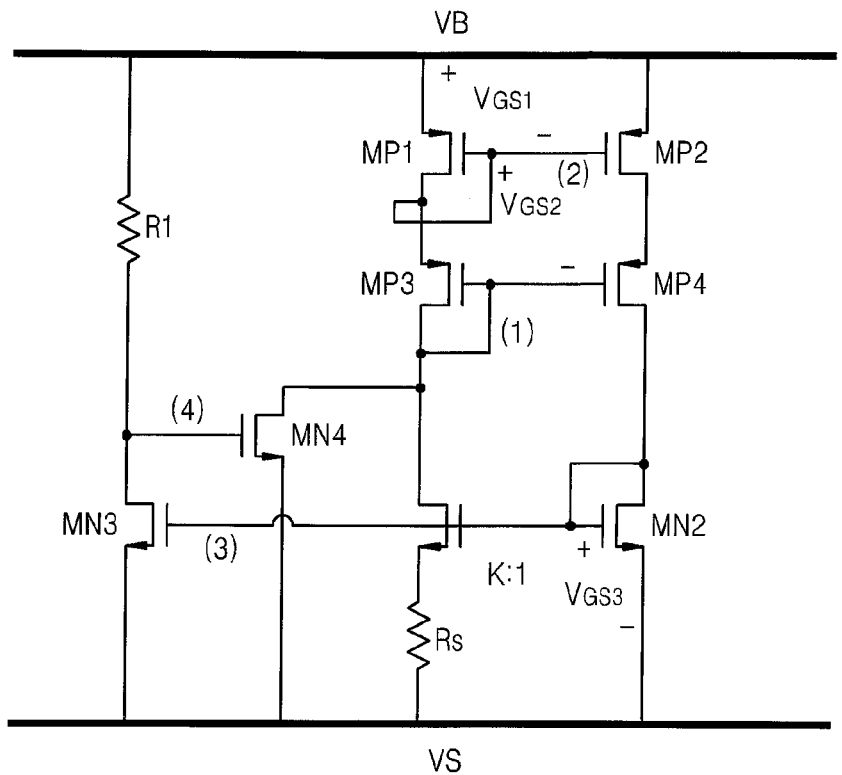
FIG. 15 is a circuit diagram of a beta multiplayer, which is an example of a current source included in a driver voltage generator of the semiconductor device of FIG. 9.
Figure 16:
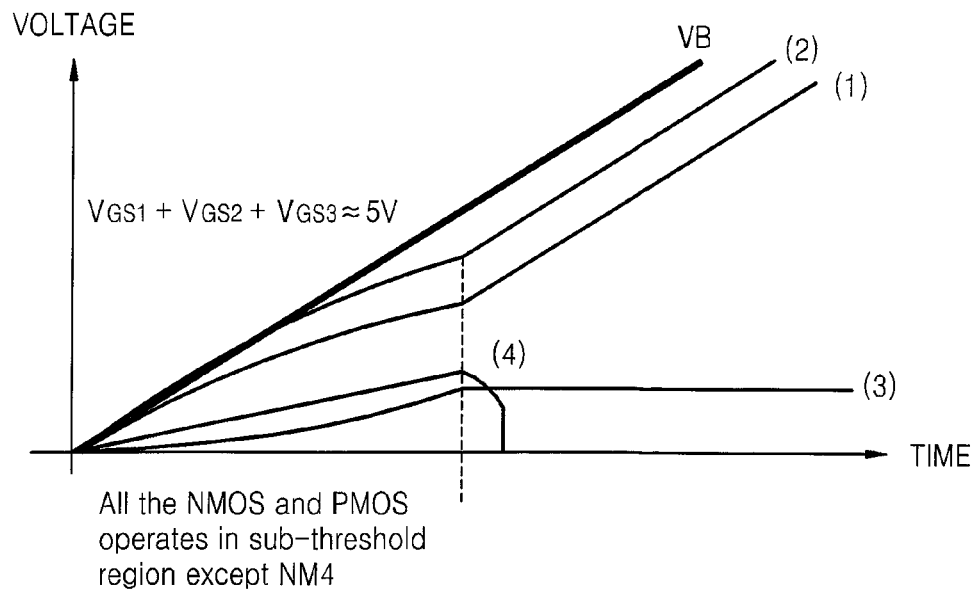
FIG. 16 is a graph showing fluctuation of an output voltage of each node with the ramp-up of the first power supply source of the beta multiplayer of FIG. 15.

The first POR signal POR1 may be generated in response to an intermediate ramp-up time. That is, the first POR signal generator 120 may be used when the ramp-up time of the supply voltage VBS is too long to be processed by the second POR signal generator 150 and still short to be processed by the UVLO module 20. To understand the principle by which a specific supply voltage is reduced at a time point when pulling down a reset signal is expected, it may be necessary to comprehend a start up sequence of a power constant (gm) current source of the current source I1. FIGS. 15 and 16 illustrate start up sequences of the constant (gm) current source.

FIG. 15 is a circuit diagram of a beta multiplier, which is an example of a current source (refer to I1 in FIG. 8) included in the driver voltage generator 110 of the semiconductor device 100e of FIG. 9, and FIG. 16 is a graph showing fluctuation of an output voltage of each node with the ramp-up of the first power supply source VB of the beta multiplier of FIG. 15.

Referring to FIGS. 15 and 16, the beta multiplier may include resistors and transistors connected between the first and second power supply sources VB and VS.

To prevent an initial deadlock situation, a start up circuit configured to discharge a drain of a transistor MN3 may include transistors MN1, MN3, and MN4. In FIG. 16, it can be seen that the first power supply source VB should reach a specific voltage level so that three bias voltages can be sufficiently boosted to drive the current source I1 in the saturated state. The specific voltage level may be expressed by the sum of marginal saturation gate-source voltages of two PMOS devices and an NMOS device that are stacked. The specific voltage level should be sufficient so as to allow the flow of current at a current level embodied by the current source I1.

The specific voltage level is expressed by Equation 2:

$$V_{sat} = V_{GS1} + V_{GS2} + V_{GS3} \quad (2).$$

Here, a bias current $I_{bias}$ and the respective marginal saturation gate-source voltages $V_{GS1}$, $V_{GS2}$, and $V_{GS3}$ are expressed by Equations 3 through 5:

$$I_{bias} = \frac{2}{\mu_n C_{ox}(W/L)_N} \left(\frac{1}{R_S^2}\right)\left(1 - \frac{1}{\sqrt{K}}\right)^2, \quad (3)$$

$$V_{GS1,2} = \sqrt{\frac{2I_{bias}}{\mu_p C_{ox}(W/L)_p}} + V_{THP}, \quad (4)$$

$$V_{GS3} = \sqrt{\frac{2I_{bias}}{\mu_n C_{ox}(W/L)_n}} + V_{THN}. \quad (5)$$

As shown in FIG. 4, it is obvious that before the supply voltage VBS corresponding to a potential difference between the first and second power supply sources VB and VS reaches a specific voltage, a very small current is provided by the beta multiplier. Accordingly, a voltage of an input terminal of the asymmetric inverter including the resistor R7 and the transistors M8 and M9 may be less than a threshold voltage of the transistor M9, thereby preventing the transistor M11 from being turned on.

Hereinafter, the problem of a power supply surge according to the inventive concept will be examined.

Figure 17:
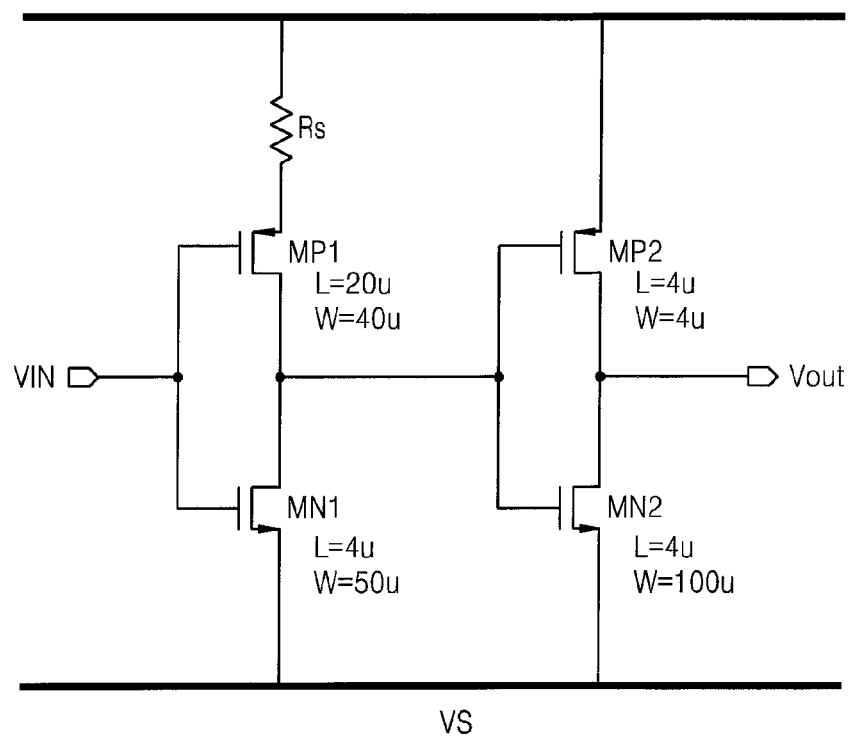
FIG. 17 shows an inverter chain structure of a second circuit generator.

As described above, a POR circuit of an HVIC may need to be reliable against sudden power supply ripples having high values. To attain this object, inverter chains embodied by the first and second POR signal generators 120 and 150 were designed according to the inventive concept. FIG. 17 shows an inverter chain structure of a second circuit generator for analysis, and FIG. 18 shows a small-signal equivalent circuit of the inverter chain structure.

Figure 18:
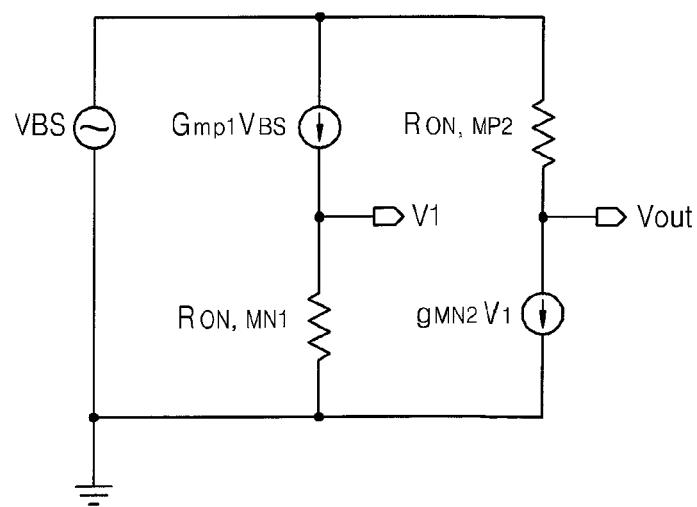
FIG. 18 is a circuit diagram of a small-signal equivalent circuit of the inverter chain structure.

Referring to FIGS. 17 and 18, a resistor Rs and a first PMOS transistor MP1 may constitute resistor common source amplifiers. Since a first NMOS transistor MN1 has a very large size, when an input voltage VIN reaches a critical voltage of the first NMOS transistor MN1, the first NMOS transistor MN1 may function as a current drain having an infinite capacity.

A second NMOS transistor MN2 and the second PMOS transistor MP1, which constitute an inverter with a very small switching point, may be sufficiently sensitive so as to minutely sense the fluctuation of a signal of a drain of the first PMOS transistor MP1 Quantitatively, a small-signal output voltage relative to the supply voltage VBS of the second POR signal generator 150 may be expressed by Equation 6:

$$V_{OUT} = \left( \frac{g_{mp1}}{1 + (g_{mp1} + g_{mpb1})R_S} \right) g_{mn2} V_{BS} R_{ON,MP2} R_{ON,MN1}, \quad (6)$$

Here, resistances of resistors $R_{ON,MP2}$ and $R_{ON,MP1}$ are expressed by Equations 7 and 8:

$$R_{ON,MP2} = \frac{1}{\mu_p C_{ox}(4/4)(V_{BS} - V_{thp})}, \quad (7)$$

$$R_{ON,MN1} = \frac{1}{\mu_n C_{ox}(50/4)(V_{IN} - V_{thn})}. \quad (8)$$

In Equations 6 through 8, assuming that a small-signal transconductance $g_m$ is about 5 μA/V and that a channel resistance RON is determined to be about several hundred Ωs at an input voltage VIN having a normal value range (e.g., an input voltage VIN of about 7V), it may be inferred that an output voltage Vout is not sensitive to the fluctuation of the supply voltage VBS.

Figure 19:
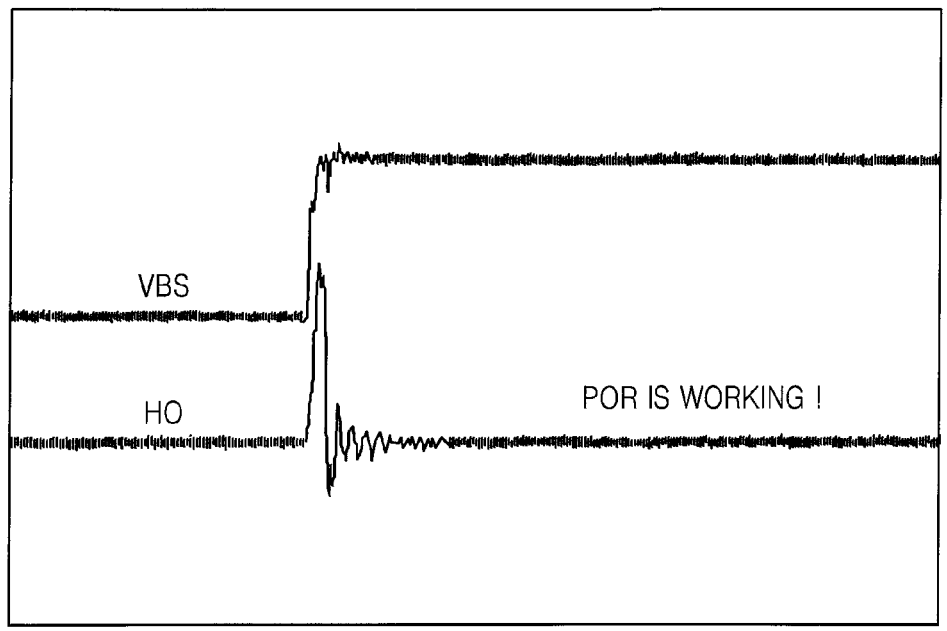
FIGS. 19 and 20 are graphs showing measurement results of a semiconductor device according to exemplary embodiments of the inventive concept.
Figure 20:
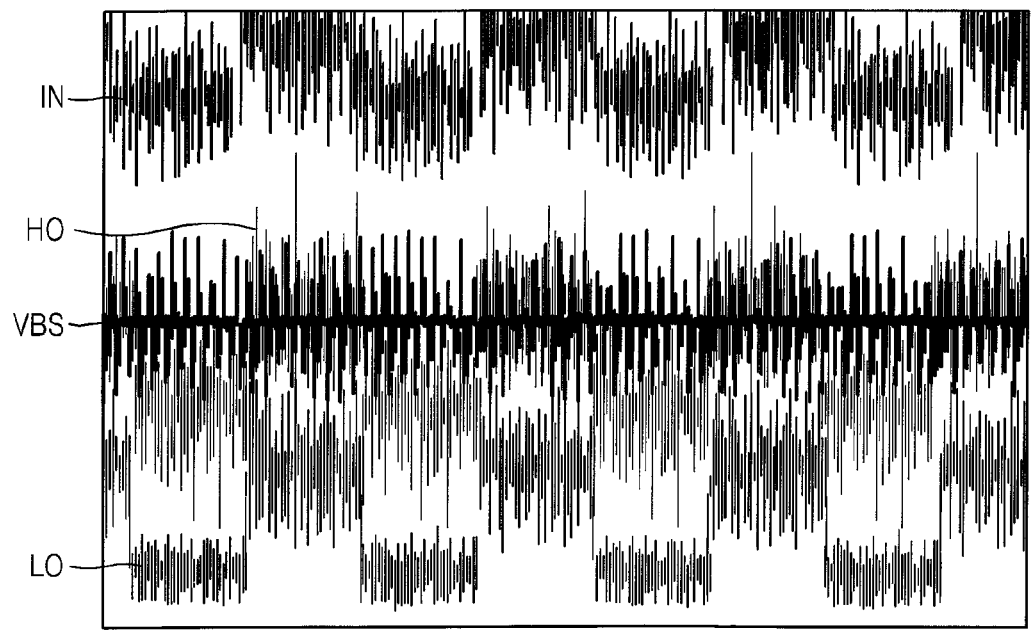

FIGS. 19 and 20 are graphs showing measurement results of a semiconductor device according to exemplary embodiments of the inventive concept.

Referring to FIG. 19, after a supply voltage VBS is ramped up, a high-side output signal HO may be at a temporary high level and then lowered to a low level in response to a POR signal.

Referring to FIG. 20, it can be seen that even if noise occurs in the supply voltage VBS, respective signals (i.e., an input signal IN, the high-side output signal HO, and a low-side output signal LO) maintain resiliency.

It will be understood that respective elements of the appended drawings have exemplary shapes for clarity and may be modified in various other shapes. Like numbers refer to like elements throughout.

A semiconductor device according to embodiments of the inventive concept may stably operate even if an electric potential of power fluctuates due to noise during a steady-mode operation after the power is ramped up. In particular, in a power semiconductor circuit, such as an HVIC, a malfunction (e.g., re-reset) in a POR circuit caused by the fluctuation of high-voltage power may be solved.

In addition, the semiconductor device according to the embodiments of the inventive concept may generate a POR signal having a wide range of ramp-up times. Accordingly, the semiconductor device may operate adaptively to the wide range of ramp-up times.

Furthermore, in the semiconductor device according to the embodiments of the inventive concept, the POR circuit may be integrated in an UVLO circuit and a passive device, such as a resistance divider, is shared between the UVLO circuit and the POR circuit, thereby reducing the entire area of the semiconductor device.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a first device configured to generate a first reset signal when a first signal is applied thereto, the first signal having a first ramp-up time and being one of a plurality of signals having different ramp-up times;
   a second device configured to generate a second reset signal when a second signal is applied thereto, the second signal having a second ramp-up time and being one of the plurality of signals; and
   a storage unit configured to receive at least one of the first reset signal and the second reset signal.

2. The semiconductor device of claim 1, wherein the second ramp-up time is longer than the first ramp-up time.

3. The semiconductor device of claim 1, further comprising:
   a driving voltage generator configured to generate a first voltage that rises at a first slope and subsequently rises at a second slope greater than the first slope; and
   a first signal generator configured to receive the first voltage and generate the first signal.

4. The semiconductor device of claim 3, wherein the first signal generator is further configured to turn off the first signal while the first voltage rises at the second slope.

5. The semiconductor device of claim 3, wherein the first signal generator includes an asymmetric inverter configured to receive the first voltage, invert the first voltage, and generate the first signal that sharply decreases with a rise of the first voltage.

6. The semiconductor device of claim 1, further comprising:
   a voltage divider connected between a first power supply source and a second power supply source and configured to provide a second voltage from an output terminal thereof;
   a capacitive unit connected between the output terminal of the voltage divider and the second power supply source; and
   a second signal generator connected to the output terminal of the voltage divider and configured to receive the second voltage and generate the second signal.

7. The semiconductor device of claim 1, further comprising:
   an undervoltage-lockout (UVLO) module configured to generate a third signal, the third signal having a third ramp-up time and being one of the plurality of signals, wherein the storage unit is further configured to receive a third reset signal generated by the third signal.

8. The semiconductor device of claim 7, wherein the storage unit is further configured to receive at least one of the first reset signal, the second reset signal, and the third reset signal.

9. The semiconductor device of claim 7, wherein the second ramp-up time is longer than the first ramp-up time and is shorter than the third ramp-up time.

10. The semiconductor device of claim 7, wherein the UVLO module comprises:
    a voltage divider connected between a first power supply source and a second power supply source and configured to provide a second voltage from an output terminal thereof;
    a reference voltage generator configured to generate a reference voltage; and
    a comparator configured to compare the second voltage of the output terminal of the voltage divider with the reference voltage and generate the third signal.

11. The semiconductor device of claim 7, further comprising:
    a first signal generator configured to generate the first signal; and
    a second signal generator configured to generate the second signal.

12. The semiconductor device of claim 11, further comprising a voltage divider connected between a first power supply source and a second power supply source.

13. The semiconductor device of claim 12, wherein the second signal generator and the UVLO module receive a voltage from the voltage divider and generate the second and third signals, respectively.

* * * * *